United States Patent
Polishchuk et al.

(10) Patent No.: US 7,141,858 B2
(45) Date of Patent: Nov. 28, 2006

(54) DUAL WORK FUNCTION CMOS GATE TECHNOLOGY BASED ON METAL INTERDIFFUSION

(75) Inventors: Igor Polishchuk, Fremont, CA (US);
Pushkar Ranade, Berkeley, CA (US);
Tsu-Jae King, Fremont, CA (US);
Chenming Hu, Alamo, CA (US)

(73) Assignee: The Regents of the University of California, Oakland, CA (US)

(*) Notice: Subject to any disclaimer, the term of this patent is extended or adjusted under 35 U.S.C. 154(b) by 102 days.

(21) Appl. No.: 10/871,338

(22) Filed: Jun. 18, 2004

(65) Prior Publication Data

US 2004/0238859 A1    Dec. 2, 2004

Related U.S. Application Data

(62) Division of application No. 10/315,476, filed on Dec. 9, 2002, now Pat. No. 6,794,234.

(60) Provisional application No. 60/353,786, filed on Jan. 30, 2002.

(51) Int. Cl.
*H01L 29/49* (2006.01)

(52) U.S. Cl. ................ 257/407; 257/371; 257/412; 257/E29.158; 257/E29.16

(58) Field of Classification Search ............ 257/204, 257/206, 350, 351, 357–359, 365–367, 371, 257/407, 412, E29.158, E29.159, E29.16
See application file for complete search history.

(56) References Cited

U.S. PATENT DOCUMENTS

| | | | |
|---|---|---|---|
| 6,166,417 A | 12/2000 | Bai et al. | |
| 6,265,258 B1 | 7/2001 | Liang et al. | |
| 6,291,282 B1 * | 9/2001 | Wilk et al. | 438/203 |
| 6,518,594 B1 * | 2/2003 | Nakajima et al. | 257/59 |
| 6,534,837 B1 | 3/2003 | Bai et al. | |
| 6,537,901 B1 | 3/2003 | Cha et al. | |
| 6,579,775 B1 | 6/2003 | Kizilyalli et al. | |
| 6,677,652 B1 | 1/2004 | Lin et al. | |
| 6,727,130 B1 | 4/2004 | Kim et al. | |

OTHER PUBLICATIONS

I. Polishchuk, P. Ranade, T.-J. King, C. Hu, "Dual Work Function CMOS Transistors by Ni-Ti Interdiffusion," IEEE Electron Device Letters, vol. 23, No. 4, pp. 200-202, Apr. 2002.

* cited by examiner

*Primary Examiner*—Marcos D. Pizarro
(74) *Attorney, Agent, or Firm*—Beyer Weaver & Thomas LLP (57) ABSTRACT

A gate structure for a MOSFET device comprises a gate insulation layer, a first layer of a first metal abutting the gate insulation layer, and a second layer overlying the first layer and comprising a mixture of the metal of the first layer and a second metal, the metal layers formed by the diffusion of the first metal into and through the second metal. The second metal can be used as the gate for a n-MOS transistor, and the mixture of first metal and second metal overlying a layer of the first metal can be used as a gate for a p-MOS transistor where the first metal has a work function of about 5.2 eV and the second metal has a work function of about 4.1 eV.

6 Claims, 8 Drawing Sheets

DUAL WORK FUNCTION CMOS GATE TECHNOLOGY BASED ON METAL INTERDIFFUSION

CROSS-REFERENCES TO RELATED APPLICATIONS

This application is a divisional of application Ser. No. 10/315,476, now U.S. Pat. No. 6,794,234, filed Dec. 9, 2002, from which priority under 35 U.S.C. §120 is claimed, and which is incorporated herein by reference. Parent patent application Ser. No. 10/315,476 claims priority from Provisional Patent Application No. 60/353,786, filed Jan. 30, 2002, which is incorporated herein by reference.

BACKGROUND OF THE INVENTION

This invention relates generally to CMOS semiconductor transistors and circuits, and more particularly the invention relates to CMOS transistors having dual work function metal gates and methods of manufacturing the same.

In producing high performance bulk CMOS integrated circuits, both n-MOS and pMOS transistors must have low threshold voltages ($V_T$). This in turn requires that the gate electrodes for the n-MOS and p-MOS transistors have different work functions. The desired work function for n-MOS transistors is around 4.1 V and the desired work function for pMOS transistors is around 5.2 V.

Polycrystalline silicon has remained the gate electrode material of choice for many years. The work function of the polycrystalline silicon can be varied from approximately 4.1 to 5.2 V by implanting either donor (n) or acceptor (p) atoms respectively. As device scaling continues beyond the 100 nm technology node, polycrystalline silicon might no longer remain the best choice for this application. The resistance of the polycrystalline silicon gate electrode is limited by the electrically active dopant concentration that can be obtained in the gate. Metal gate electrodes overcome these limitations, due to high free electron concentration in the metallic materials. Polycrystalline silicon is also unstable on the many advanced (high permittivity) gate dielectrics.

Further, as the channeling of CMOS transistors continues to be scaled beyond 100 nm, the capacitance equivalent thickness (CET) of the gate dielectric has to be reduced to less than 15 Å. One way to decrease the CET while maintaining acceptable gate leakage is to use high-k dielectrics instead of silicon oxide. Another way is to replace the polysilicon gate with a metal gate, as noted above, thus eliminating depletion at the gate/dielectric interface and reducing the CET by a couple of angstroms. In addition, metal gate materials may ultimately be necessary for high-k gate dielectrics because polycrystalline silicon has been found to be thermodynamically unstable on some high-k materials such as $Ta_2O_5$ and $ZrO_2$. In order to achieve surface-channel p- and n-MOSFETs with low and symmetrical threshold voltages, two different metals with different work functions must be used in a metal gate CMOS technology. A straightforward process for dual-metal gate technology includes blanket deposition of a first gate metal followed by selectively removing the first metal from either the n-MOS or p-MOS regions. Thereafter, a second gate metal is deposited over the entire wafer. Afterwards, the n-MOS and p-MOS gate electrodes are patterned. Unfortunately, this approach exposes the gate dielectric to a metal-etching process in the regions from which the first gate metal is selectively removed, and consequently causes undesirable thinning of the gate dielectric and potential reliability problems.

The present invention is directed to an improved method of fabricating dual metal gates for CMOS transistors and the resulting structures.

BRIEF SUMMARY OF THE INVENTION

Briefly, the interdiffusion of metals is employed to form dual metal gates with different work functions without the need for removing metal from the gate dielectric.

In one embodiment, two layers of different metals are formed on gate dielectric overlying P and N wells in a semiconductor substrate. The top or second layer of metal is removed from over one well, and then the metal layers are annealed at an elevated temperature. The bottom or first layer of metal forms a first metal gate, and the metal from the top or second layer diffuses through the bottom or first layer and effectively alters the gate work function of the second metal gate.

In order to fabricate bulk p- and n-MOS devices with favorable threshold voltages, one of the metals must have a work function similar to that of n-type silicon (for example, Ti, Ta, Nb), and the other metal must have a work function similar to that of P-type silicon (for example, Ni, Ir, Mo). It is also important that the second metal (top layer metal) has a sufficiently high diffusivity in the first metal (bottom layer metal) and has a propensity to segregate to the gate dielectric interface. A good example of such a pair of metals is Ni and Ti. Ni diffuses easily through Ti and segregates at the silicon oxide interface.

In other embodiments, a barrier layer can be provided between the first and second metal layers over the doped well where no metal diffusion is desired. This is done before the second or top metal layer is formed by first forming the barrier layer over both wells and then selectively removing the barrier layer where metal diffusion is desired. Alternatively, the barrier layer can be left in place over both wells, and after the second metal layer is formed over the barrier layer, the barrier can be effectively removed from over one well by selective ion implant into the barrier layer.

The metal diffusion process is readily employed either before or after source and drain formation, thereby avoiding high temperature processing in forming the source and drain regions, if necessary.

The invention and objects and features thereof will be more readily apparent from the following detailed description and appended claims when taken with the drawings.

DETAILED DESCRIPTION OF THE INVENTION

FIGS. 1–6 are section views illustrating the fabrication of a CMOS pair in accordance with one embodiment of the invention. In this embodiment, titanium, Ti, is employed as a first metal layer, and nickel, Ni, is employed as the second metal layer since Ni diffuses easily through Ti and segregates at the silicon oxide interface. Moreover, Ti has a work function similar to that of n-type silicon, whereas Ni has a work function similar to that of p-type silicon.

Figure 1:
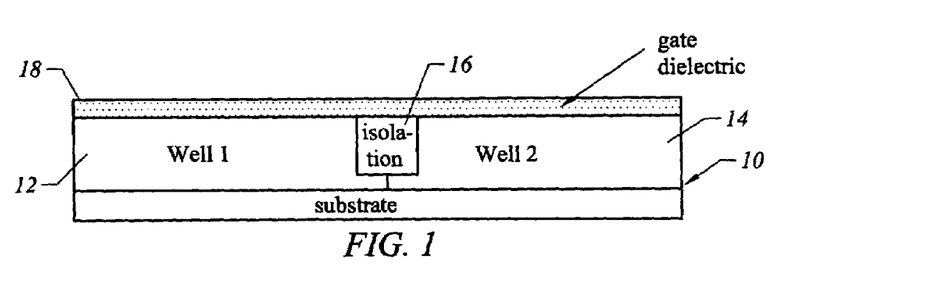
FIGS. 1–6 are section views illustrating steps in fabricating a CMOS transistor pair in accordance with one embodiment of the invention.

In FIG. 1 a silicon substrate 10 has a p-doped well 1 shown at 12 and an n-doped well 2 shown at 14 formed in a surface of the substrate with an isolation region 16 separating the two wells. A gate dielectric 18 of silicon oxide, for example, is formed on the surface of the two wells.

Figure 2:
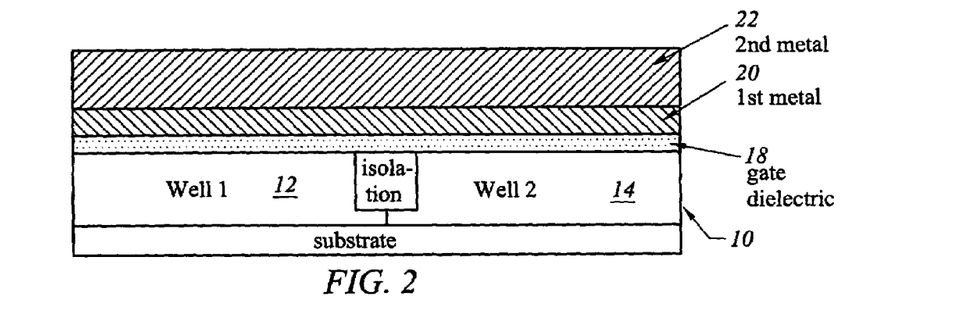

In FIG. 2 a first metal layer 20 of titanium is formed on silicon oxide layer 18, and a second metal layer 22 of nickel is formed over the titanium layer 20. The two metal layers are preferably formed by chemical vapor deposition or sputtering with the titanium layer having a thickness of about 5–20 nm and the nickel layer having a thickness of about 20–100 nm.

Figure 3:
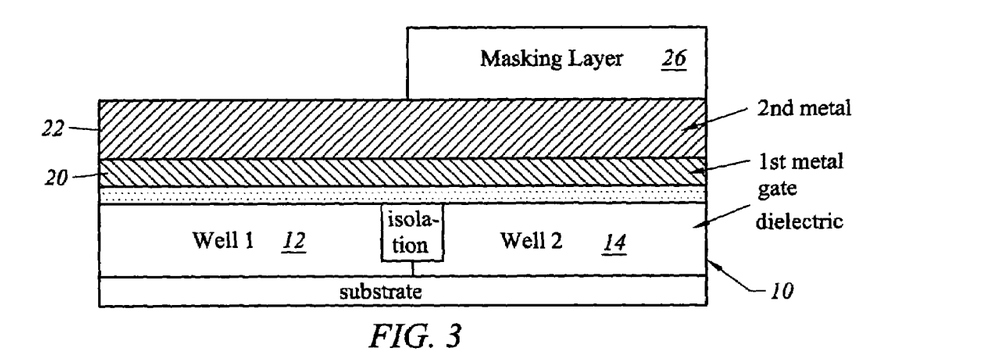

Thereafter, as shown in FIG. 3, a photoresist masking layer 26 is deposited and patterned in order to expose the second metal layer 22 over P well 12. Subsequently, the second metal layer is selectively removed from the area over P well 12 so that the work function of the gate electrode over well 12 will be solely determined by the titanium metal.

Figure 4:
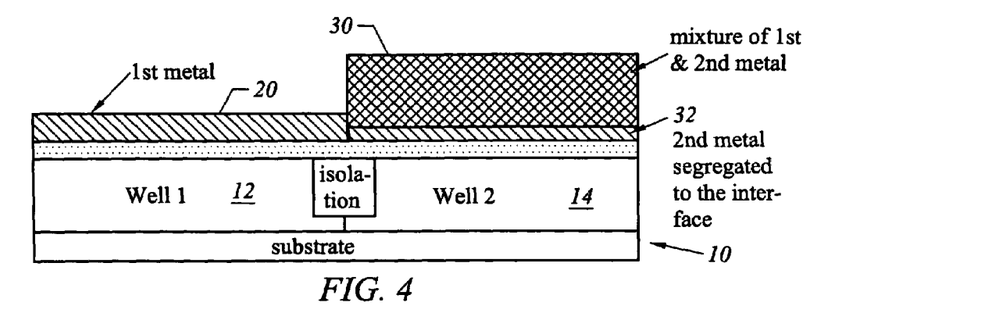

Next the masking layer is removed and the substrate is annealed at an elevated temperature. FIG. 4 shows substrate 10 after the annealing step with layer 30 comprising a mixture of Ni and Ti. As a result of the annealing, the second metal, Ni, diffuses through the first metal layer, Ti, and segregates as layer 32 at dielectric interface over the N well 14. Thus, the second metal determines the gate work function of devices formed in well 14.

Figure 5:
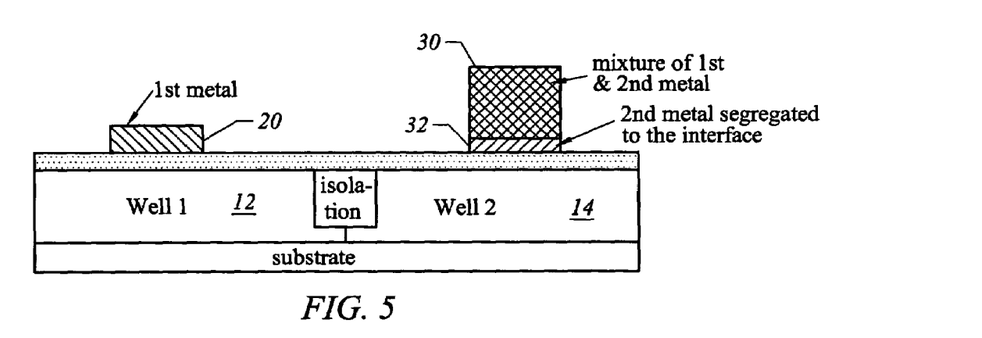
Figure 6:
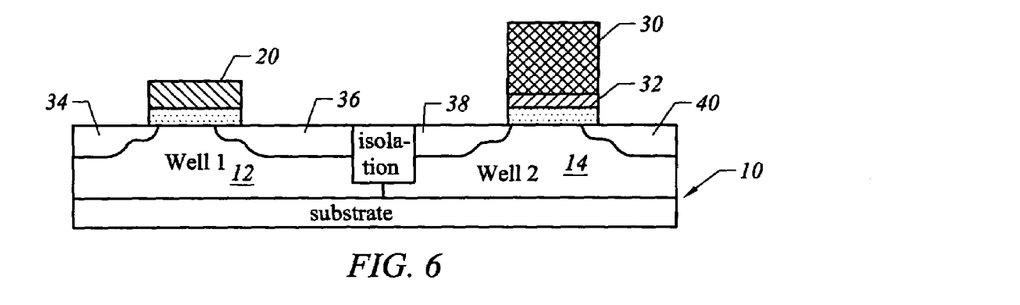

FIG. 5 shows the substrate after the gate electrodes are patterned and etched. The gate over well 12 comprises titanium 20, while the gate over well 14 comprises a mixture of titanium and nickel at 30 with the nickel diffusing through the titanium and segregating at the dielectric interface over well 14 as shown at 32. The transistors are completed as shown in FIG. 6 by the formation of n-doped source and drain regions 34, 36 in well 12 for a n-MOS transistor, and the formation of p-doped source and drain regions 38, 40 for a p-MOS transistor in well 14.

As noted above, in order to fabricate bulk p- and n-MOS transistors with favorable threshold voltages, one of the metals must have a work function similar to that of n-type silicon (for example, Ti, Ta, Nb), and the other metal must have a work function similar to that of p-type silicon (for example, Ni, Ir, Mo, Ru). It is also important that the second metal (top layer metal) has a sufficiently high diffusivity in the first metal (bottom layer metal) and has a propensity to segregate to the gate dielectric interface. A good selection is Ni and Ti, as described above.

However, while bulk CMOS applications require that the two metal gate materials have work functions of around 4.1 and 5.2 volts, other applications might require different work function values for the optimal circuit performance. Therefore, different metals can be selected, for example, ultrathin body CMOS devices require that a pair of metals with work functions of around 4.4 and 4.9 electron-volts be used. Furthermore, the choice of the gate electrode materials is not limited to pure elemental metals but includes other materials with metallic properties, for example, alloys, metallic oxide, nitrides, silicates, and the like.

Figure 7:
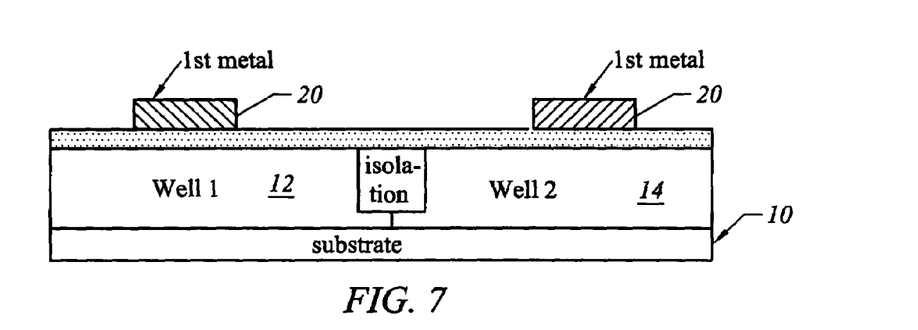
FIGS. 7 and 8 are section views illustrating a "gate last" sequence in fabricating a CMOS transistor pair in accordance with another embodiment of the invention.
Figure 8:
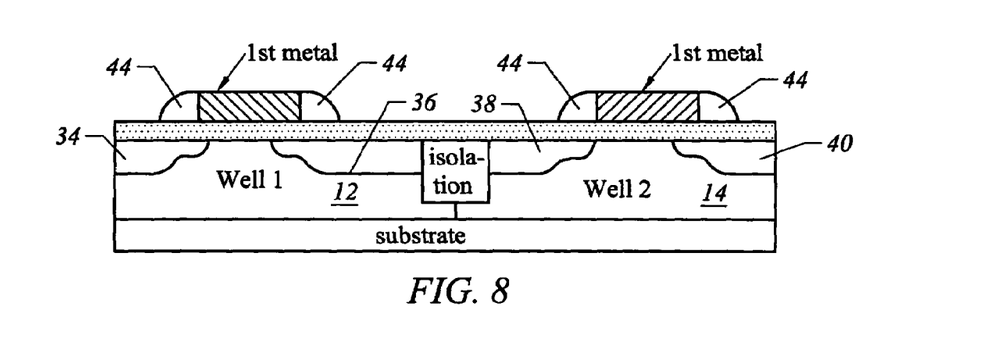

While FIGS. 1–6 illustrate a straightforward way to fabricate a dual work function metal gate CMOS transistor pair with the traditional "gate-first" process, it may be undesirable to expose the gate stack to the high temperature processing required to form the source and drain regions. In this case, a "gate-last" process, as illustrated in FIGS. 7 and 8, may be preferred. In FIG. 7, the substrate 10 of FIG. 1 is shown after the first metal layer 20 is deposited, patterned, and etched. Thereafter, as shown in FIG. 8, the source and drain regions 34, 36 and 38, 40 along with gate sidewall spacers 44 are formed. Thereafter the second metal layer (not shown) is deposited and selectively removed from the gate area above well 12 and the interdiffusion anneal is performed.

Figure 9:
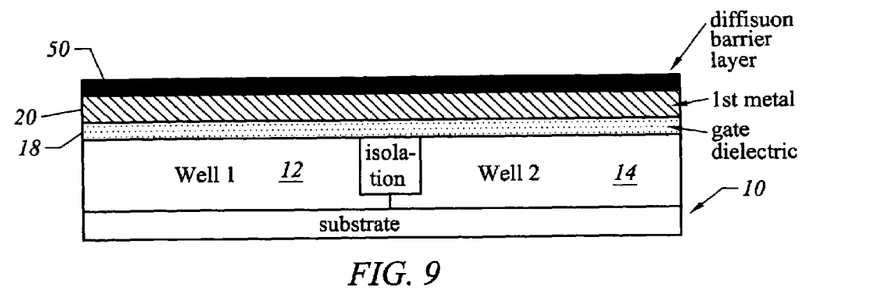
FIGS. 9 and 10 are section views illustrating an alternative embodiment of fabricating a CMOS transistor pair in accordance with the invention.
Figure 10:
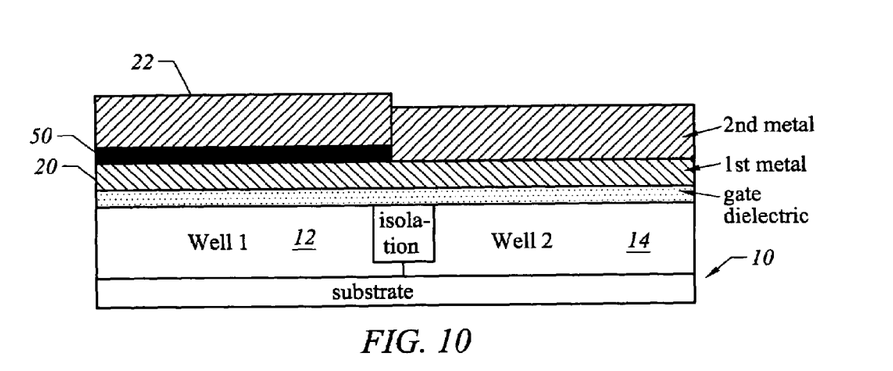

Selective etching of the second metal layer from the area above well 12 is one way to prevent interdiffusion from occurring in that area. However, there are other ways to prevent the interdiffusion from occurring including the use of a barrier layer between the first and second metal layers as illustrated in FIGS. 9–12. In FIG. 9 diffusion barrier layer 50 is deposited over the first metal layer 20. The barrier material can be Molybdenum, Mo, for Ti and Ni metal layers. The barrier layer is then removed from above well 14, and the second metal layer is deposited as shown in FIG. 10. The structure can then be annealed to effect the interdiffusion of metal in layer 22 through the metal in layer 20, such as illustrated in FIG. 4.

Figure 11:
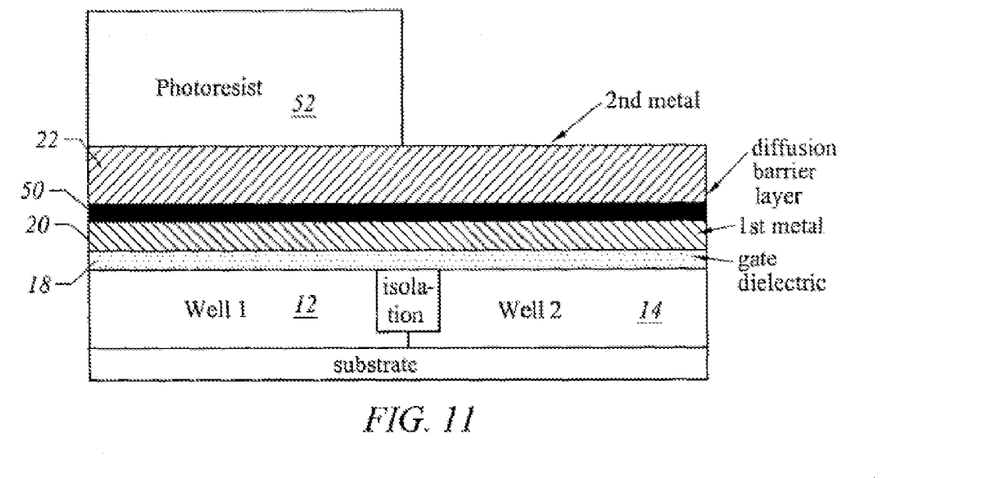
FIGS. 11 and 12 are section views illustrating another embodiment for making a CMOS transistor pair in accordance with the invention.
Figure 12:
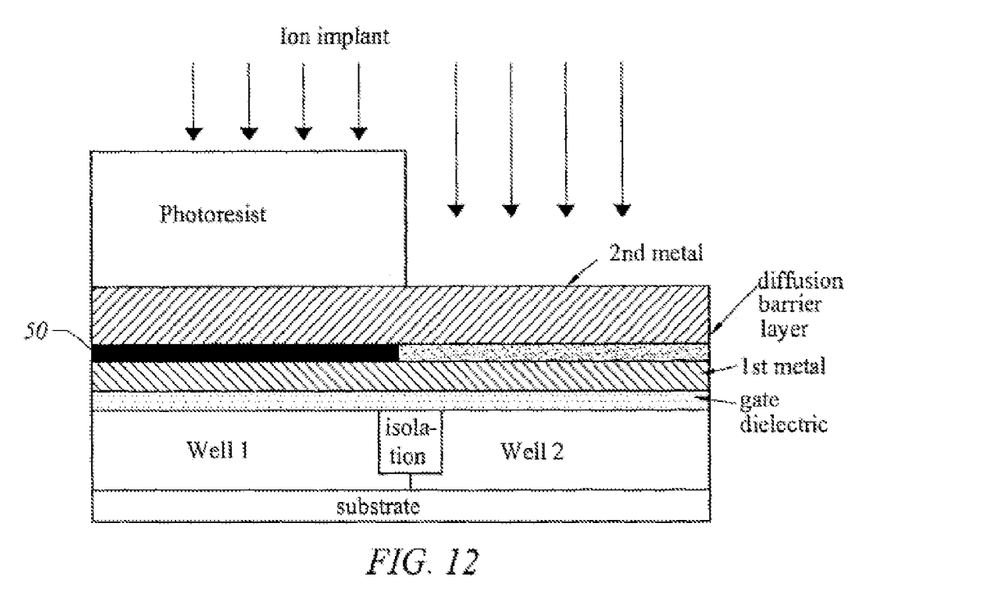

Alternatively, the diffusion barrier layer 50 does not have to be physically removed but instead the diffusion-preventing function of the barrier layer can be eliminated by ion implantation, for example, as illustrated in FIGS. 11 and 12. In FIG. 11, photoresist 52 is formed and patterned over well 12 and functions as an ion implant mask and protects the underlying portion of barrier layer 50. However, the exposed barrier layer receives ion implant of an inert species such as Ar or a species already present in the stack such as Ni and thereafter allows the diffusion of the nickel in layer 22 into the titanium of layer 20, similar to the structure of FIG. 4. The energy, angle, and dose of the implant should be chosen in such a way that the barrier layer be sufficiently damaged, while negligible amount of the implanted species can reach the gate dielectric. The values of the implant energy, angle, and dose depend on the thickness of the layers in the gate stack. For example, when the gate stack consists of 200 A of Ti and 200 A of Ni separated by 50 A of Mo, the following values can be used: Implant energy around 40 keV for Ar implant and 50 keV for Ni implant. Implant tilt angle –30 degrees. Dose on the order of 5E15.

To demonstrate the feasibility and advantages of the metal interdiffusion gate (MIG) CMOS technology, a simple non-self-aligned gate-last process with $SiO_2$ gate dielectric and n- and p-MOSFET fabricated on separate wafers was fabricated. In this MIG CMOS process, a thin layer of Ti (low work function metal $\Phi_M$~4 V) is deposited over the entire wafer, followed by a somewhat thicker layer of Ni (high work function metal $\Phi_M$~5 V). Ni is then selectively removed from the n-MOS regions, while p-MOS regions are protected by photoresist. Since only Ti remains in the n-MOS regions, its work function clearly determines the n-MOS threshold voltage ($V_T$). A 400° C. anneal is then applied in order to interdiffuse the Ti and Ni layers in the p-MOS regions. Ni has a propensity to segregate to the SiO.sub.2 interface. Consequently, the work function of Ni determines the p-MOS $V_T$.

Figure 13A:
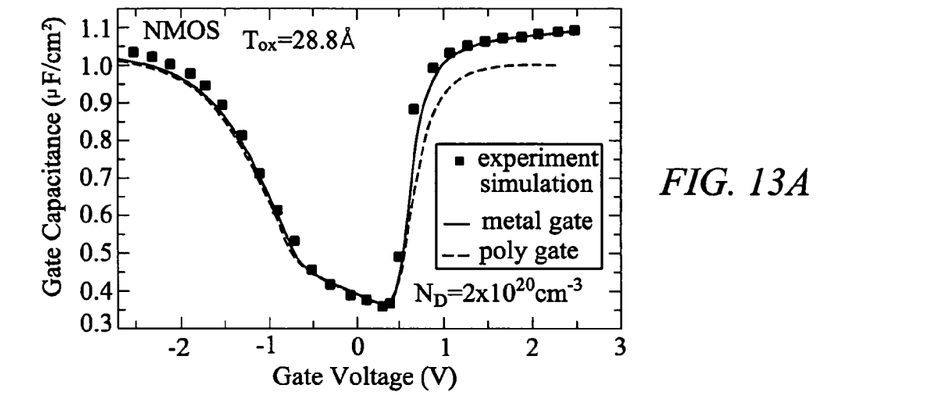
FIGS. 13A–13C are graphs illustrating capacitance versus voltage characteristics for nMOSFET and p-MOSFET devices manufactured in accordance with the invention.
Figure 13B:
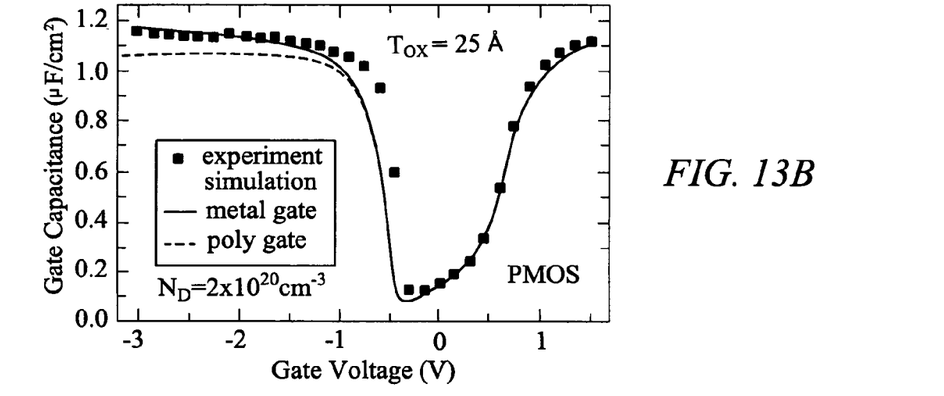
Figure 13C:
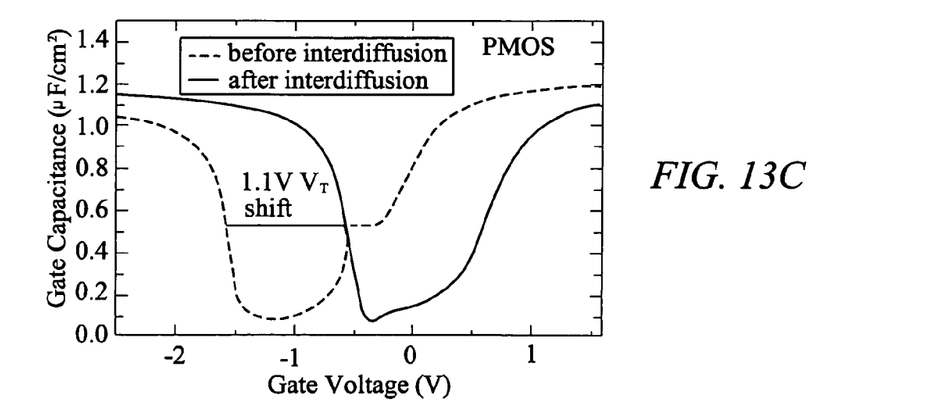

The thicknesses of the Ti and Ni layers used in this experiment were 80 and 200 Å, respectively. A 15-min 400° C. interdiffusion anneal was peformed in the forming gas ambient. A low $V_T$ of about 0.5 V is achieved for n-MOS transistors with Ti gate, as can be seen from the capacitance-voltage (C-V) characteristic (FIG. 13A). As deposited, the p-MOS Ti/Ni gate electrode has an effective gate work function corresponding to that of Ti, resulting in a high threshold voltage (FIG. 13C). However, after the interdiffusion anneal, Ni segregates to the gate dielectric interface, and from that point on determines the gate work function resulting in a low $V_T$ of about −0.5V for the p-MOS transistors. Metal gates successfully eliminate polysilcon depletion for both n-MOS and p-MOS devices (FIGS. 13A, 13B), resulting in a significant increase in the inversion capacitance as compared to polysilicon gated devices.

Figure 14:
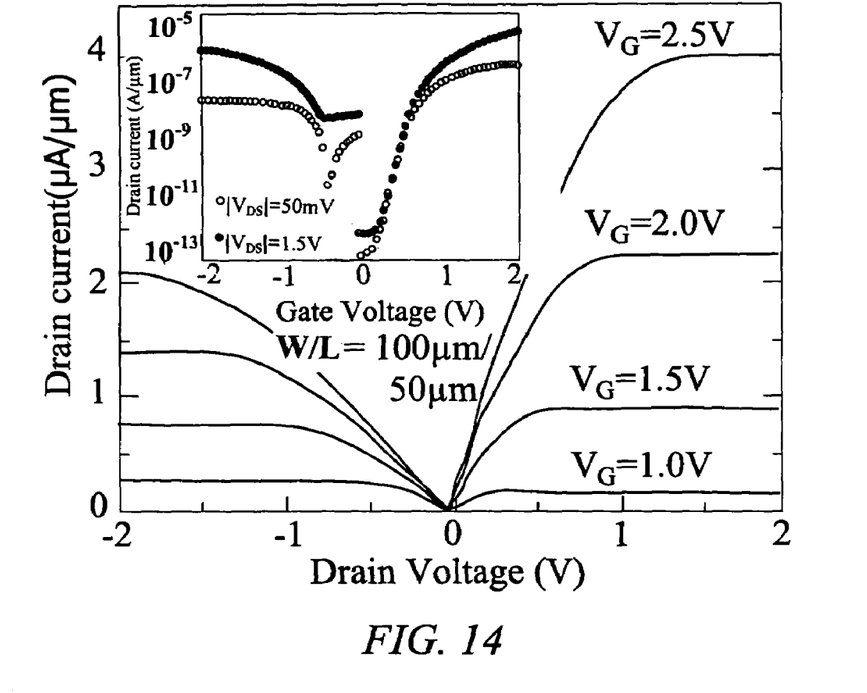
FIG. 14 is a graph illustrating I.sub.D versus V.sub.D characteristics for p-MOS and n-MOS long channel transistors manufactured in accordance with the invention.

The fabricated long-channel n-MOS and p-MOS transistors have well-behaved $I_D$–$V_D$ characteristics (FIG. 14). The n-MOSFETs show excellent turn-off characteristics; however, the p-MOSFETs show large off-state leakage. The leakage is attributed to tunneling between the drain and the gate in the large overlap region, and can be avoided by using a self-aligned fabrication process.

Figure 15:
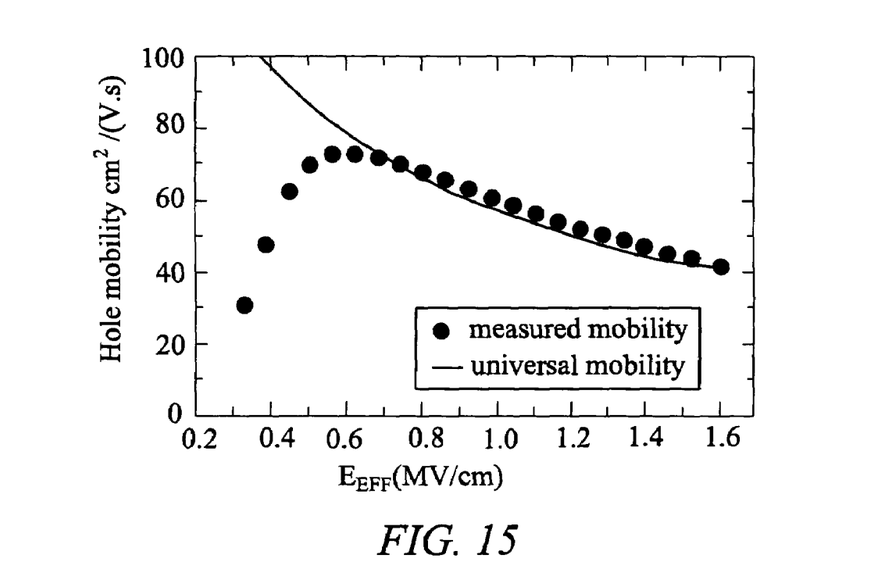
FIG. 15 is a graph illustrating measured p-MOSFET hole mobility for a transistor manufactured in accordance with the invention.
Figure 16:
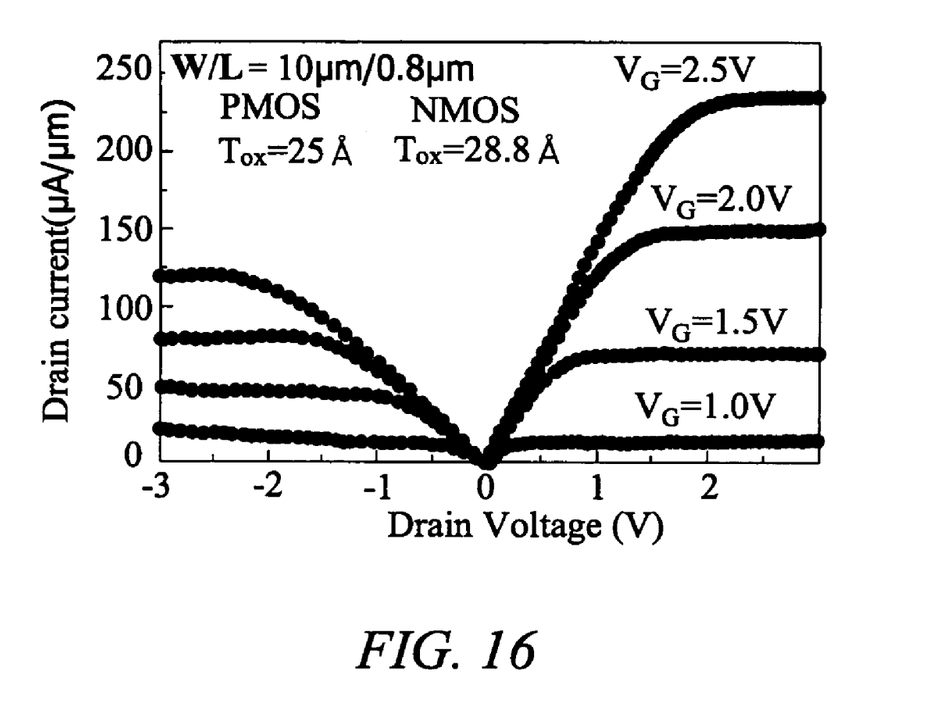
FIG. 16 is a graph illustrating drain current versus drain voltage for CMOS transistors make in accordance with the invention.

Since metal penetration through the gate dielectric during the interdiffusion anneal is a potential issue for the proposed MIG technology, we have investigated the p-MOS channel hole mobility. The fact that it closely matches the universal mobility model (FIG. 15) indicates that there is no metal penetration into the channel region. The fabricated submicron CMOS transistors show excellent drive current (FIG. 16) indicating scalability of this process.

Nickel is thermally stable on $SiO_2$ even at the high temperatures necessary for source/drain activation. Titanium, however, is known to react with $SiO_2$ above 400° C. and can be used only in a "gate-last" process. Both Ti and Ni are expected to be compatible with high-k dielectrics such as $HfO_2$ and $ZrO_2$, even with a traditional gate-first process, while alternative pairs of metals (thermally stable on $SiO_2$ under high temperature annealing) will ultimately be needed for $SiO_2$-based MIG technology.

A new method for achieving dual work function metal gates for CMOS transistors is successfully demonstrated. Low V.sub.Ts are achieved for both n-MOS and p-MOS transistors without compromising the integrity of the gate dielectric. Together with the use of high-k dielectrics, MIG technology can provide the means for aggressive scaling of the gate dielectric CET for improvement of CMOS performance beyond the 100 nm technology node. It will be appreciated by those skilled in the art that the described process for p-doped wells and for n-doped wells can be reversed in forming the gate structures. Further, other dielectrics can be employed such as high-K gate dielectrics such as $HfO_2$ and $ZrO_2$ as well as alloys, metallic oxides, nitrides, silicates and other known dielectrics.

Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A CMOS transistor pair comprising
   a) a first MOS transistor of one conductivity type having a source and a drain separated by a channel and a first gate over the channel and separated therefrom by an insulator, the first gate comprising a titanium layer abutting the insulator and having a first work function, and
   b) a second MOS transistor of second conductivity type having a source and a drain separated by a channel and a second gate over the channel and separated therefrom by an insulator, the second gate comprising a mixture of titanium and nickel and a layer of nickel, the layer of nickel abutting the insulator and having a work function different from the first work function.

2. The CMOS transistor pair as defined by claim 1 wherein the work function of the titanium layer is on the order 4.1 eV and the work function of the nickel layer is on the order of 5.2 eV.

3. The CMOS transistor pair as defined by claim 1 wherein the first MOS transistor is an n-MOS transistor and the second MOS transistor is a p-MOS transistor.

4. The CMOS transistor pair as defined by claim 1 wherein the thickness of the titanium layer is on the order of 5–20 nm and the thickness of the nickel layer is in the order of 20–100 nm.

5. The CMOS transistor pair as defined by claim 4 wherein the CMOS transistor pair is formed in a silicon substrate and the insulator comprises silicon oxide.

6. The CMOS transistor pair as defined by claim 5 wherein the work function of the titanium is on the order of 4.1 eV and the work function of the nickel is on the order of 5.2 eV.

* * * * *